United States Patent
Koo et al.

(10) Patent No.: US 8,294,178 B2
(45) Date of Patent: Oct. 23, 2012

(54) LIGHT EMITTING DEVICE USING COMPOUND SEMICONDUCTOR

(75) Inventors: Bun-Hei Koo, Seoul (KR); Jae-Eung Oh, Kyunggy (KR)

(73) Assignee: Wooree E&L Co., Ltd., Gyeonggi-do (KR)

( * ) Notice: Subject to any disclaimer, the term of this patent is extended or adjusted under 35 U.S.C. 154(b) by 239 days.

(21) Appl. No.: 12/667,325

(22) PCT Filed: Dec. 2, 2008

(86) PCT No.: PCT/KR2008/007104
§ 371 (c)(1),
(2), (4) Date: Dec. 30, 2009

(87) PCT Pub. No.: WO2009/072787
PCT Pub. Date: Jun. 11, 2009

(65) Prior Publication Data
US 2011/0006320 A1    Jan. 13, 2011

(30) Foreign Application Priority Data
Dec. 5, 2007  (KR) .................. 10-2007-0125629

(51) Int. Cl.
*H01L 33/00*    (2010.01)
(52) U.S. Cl. .......... 257/101; 257/E33.048; 257/E33.034
(58) Field of Classification Search .................. 257/101, 257/96, E33.055, E33.048, E33.025, E33.027, 257/E33.028, E33.034, E33.033, 94
See application file for complete search history.

(56) References Cited

U.S. PATENT DOCUMENTS

| | | | |
|---|---|---|---|
| 7,301,173 B2* | 11/2007 | Shim et al. | 257/79 |
| 7,998,771 B2* | 8/2011 | Bae | 438/39 |
| 2006/0192207 A1* | 8/2006 | Wook Shim et al. | 257/79 |
| 2006/0219999 A1* | 10/2006 | Shim et al. | 257/13 |
| 2007/0029541 A1* | 2/2007 | Xin et al. | 257/14 |
| 2007/0045655 A1* | 3/2007 | Song et al. | 257/104 |
| 2007/0096143 A1* | 5/2007 | Kim et al. | 257/103 |
| 2007/0145406 A1* | 6/2007 | Han et al. | 257/103 |
| 2008/0032434 A1* | 2/2008 | Chuang et al. | 438/38 |
| 2009/0085054 A1* | 4/2009 | Jeon et al. | 257/101 |
| 2010/0006884 A1* | 1/2010 | Ou et al. | 257/98 |

FOREIGN PATENT DOCUMENTS

| | | |
|---|---|---|
| KR | 10-631971 | 9/2006 |
| KR | 10-2007-27327 | 3/2007 |
| KR | 10-721160 | 5/2007 |

* cited by examiner

*Primary Examiner* — Matthew Landau
*Assistant Examiner* — Latanya N Crawford
(74) *Attorney, Agent, or Firm* — Husch Blackwell LLP; Samuel Digirolamo

(57) ABSTRACT

There is provided a light emitting device using a compound semiconductor, which can improve electrical characteristics and internal quantum efficiency by maximizing the recombination rate of electrons and holes in an active layer. The light emitting device using a compound semiconductor includes a substrate; a compound semiconductor layer formed on the substrate, the compound semiconductor layer comprising an active layer; and a current spreading layer formed on at least one of the top and bottom surfaces of the active layer, the current spreading layer allowing electrons or holes to be uniformly spread into the active layer.

10 Claims, 2 Drawing Sheets

[Fig. 1] Prior Art
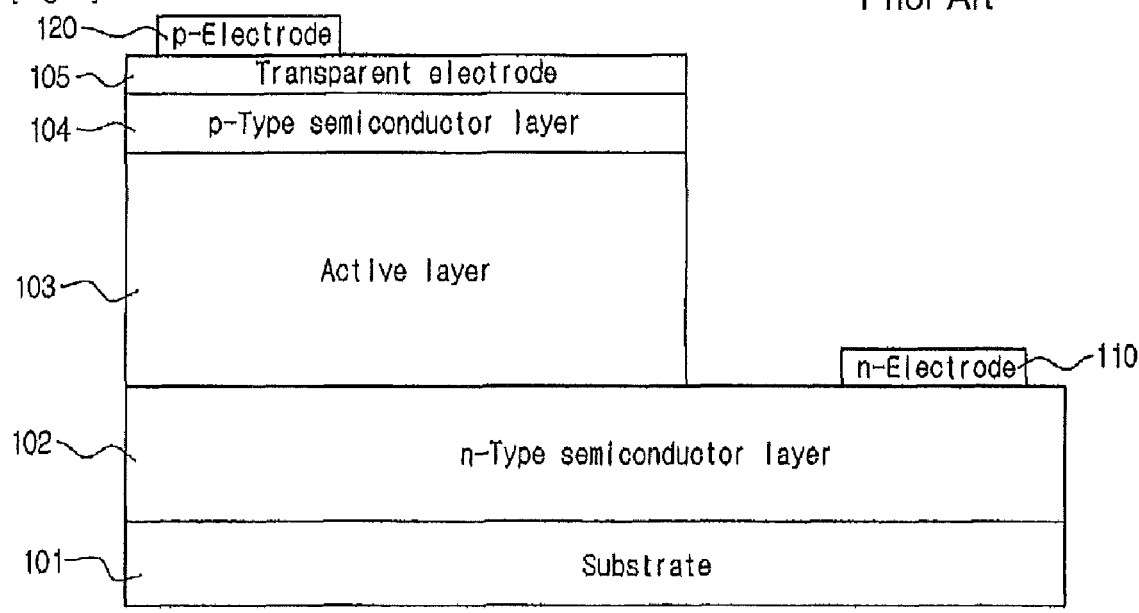
[Fig. 2]
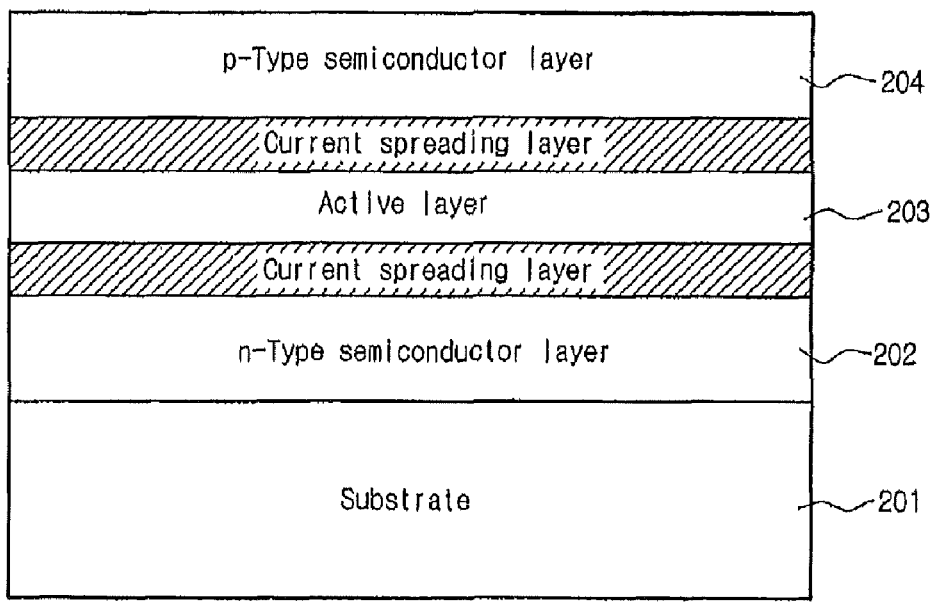
[Fig. 3]
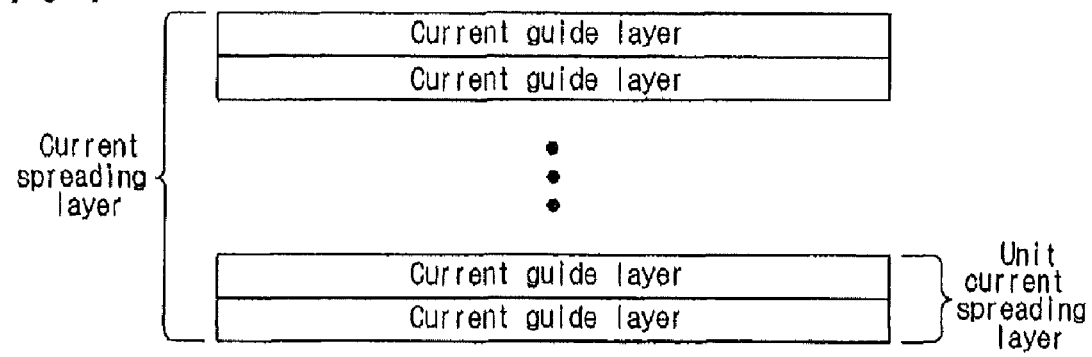

[Fig. 4]
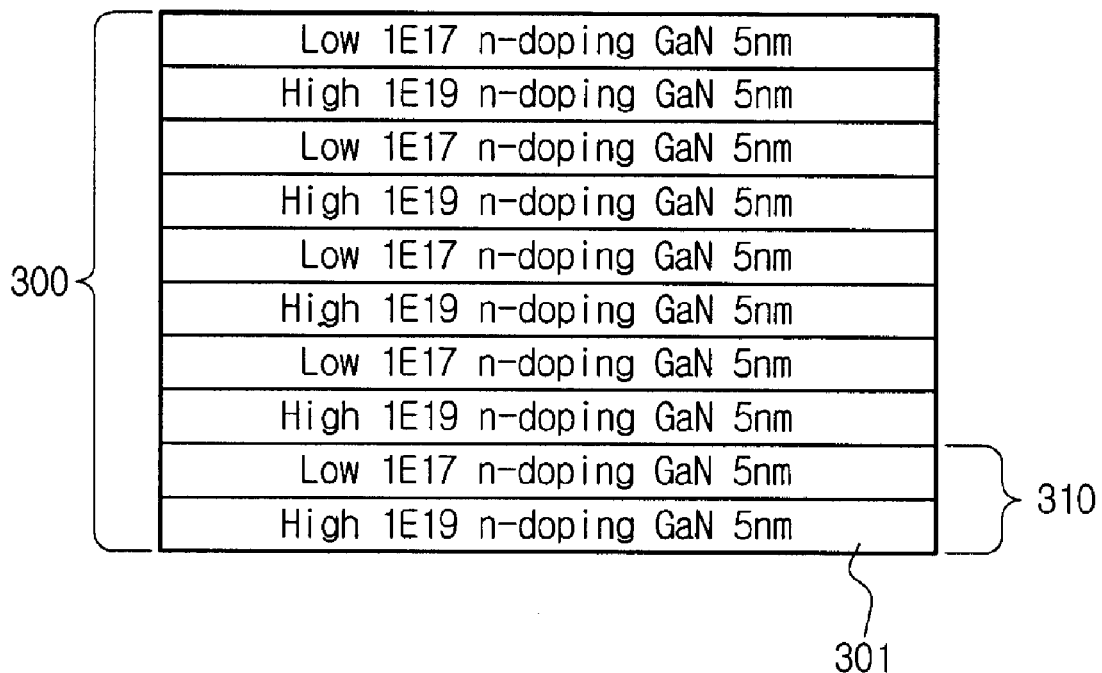
[Fig. 5]
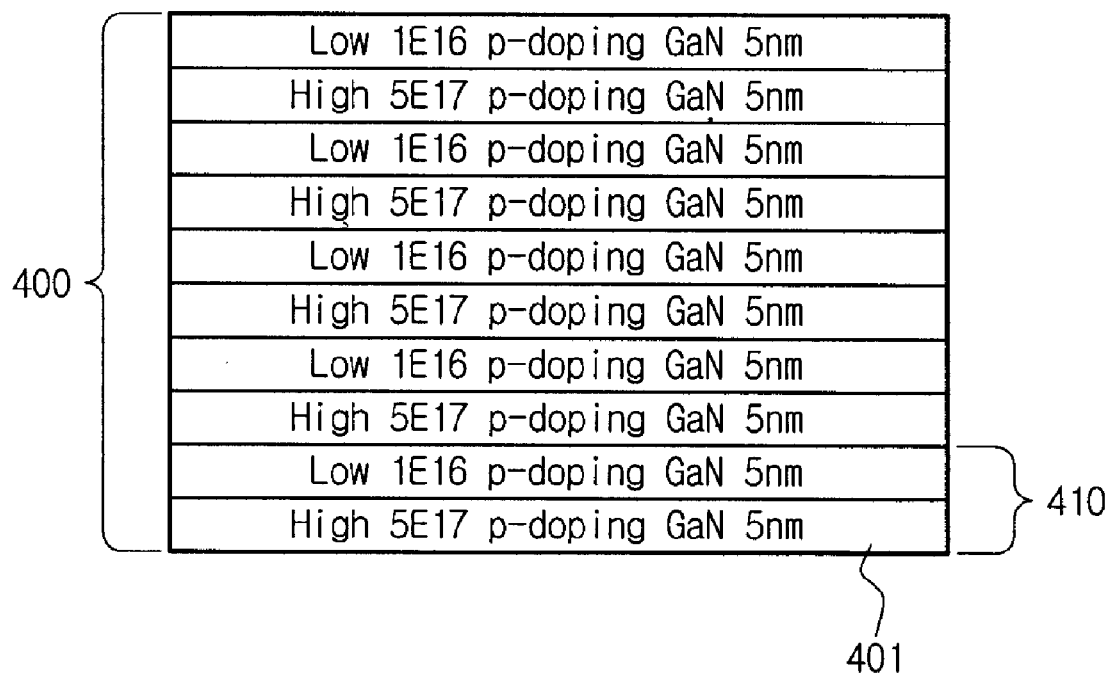

LIGHT EMITTING DEVICE USING COMPOUND SEMICONDUCTOR

CROSS REFERENCE TO RELATED APPLICATIONS

This application is a U.S. National Phase Application of International Application PCT Application No. PCT/KR2008/007104 filed on 2 Dec. 2008, which claims the benefit of priority from Korean Patent Application No. 10-2007-0125629 filed on 5 Dec. 2007. The disclosures of International Application PCT Application No. PCT/KR2008/007104 and Korean Patent Application No. 10-2007-0125629 are incorporated herein by reference.

TECHNICAL FIELD

This disclosure relates to a light emitting device using a compound semiconductor, and more particularly, to a light emitting device using a compound semiconductor, which can improve electrical characteristics and internal quantum efficiency by maximizing the recombination rate of electrons and holes in an active layer.

BACKGROUND ART

A light emitting diode (hereinafter, referred to as an LED) is a semiconductor device that converts current into light. Since a red LED using a GaAsP compound semiconductor was commercialized in 1962, GaP:N-based green LEDs and the like have been used as display light sources of electronic devices including information and communication devices.

Recently, light emitting devices using a nitride-based compound semiconductor have come into the spotlight. One of the reasons is that semiconductor layers emitting green, blue and white light can be fabricated by combining GaN with an element such as In or Al. Such nitride-based light emitting devices are used in various applications such as flat panel displays, traffic lights, indoor lightings, high-resolution output systems and optical communications.

The structure of a commonly used nitride-based light emitting device will be described. As shown in FIG. 1, the nitride-based light emitting device includes an n-electrode 110, a substrate 101, a nitride-based semiconductor layer and a p-electrode 120. The nitride-based semiconductor layer is formed by sequentially laminating an n-type semiconductor layer 102, an active layer 103 and a p-type semiconductor layer 104. The n-electrode 110 and the p-electrode 120 are formed on the n-type and p-type semiconductor layers 102 and 104, respectively.

In the nitride-based light emitting device, when a voltage is applied between the n-electrode 110 and the p-electrode 120, electrons and holes are respectively generated from the n-type and p-type semiconductor layers 102 and 104 and flow into the active layer 103. The electrons and holes are recombined with each other, so that light is emitted from the active layer 103.

To improve light extraction efficiency of the active layer 103, the concentration of electrons generated from the n-type semiconductor layer 102 needs to be similar to that of holes generated from the p-type semiconductor layer 104.

However, in the related art nitride-based light emitting device, the n-type semiconductor layer 102 generally generates electrons having a concentration of $1.0 \times 10^{19}$ cm$^{-3}$, whereas the p-type semiconductor layer 104 generally generates holes having a concentration of $5.0 \times 10^{17}$ cm$^{-3}$ due to a low efficiency of generating holes. Although a larger quantity of p-type impurities may be doped into the p-type semiconductor layer 104, doping efficiency of the p-type impurities may be lowered due to the low efficiency of generating holes as described above.

Accordingly, the resistance of the n-type semiconductor layer 102 is relatively smaller than that of the p-type semiconductor layer 104, and electrons and holes are concentrated in a region of the active layer 103 close to the p-electrode 120. Therefore, when applying current, the current is not uniformly spread into the entire region of the active layer 103, so that electrical characteristics of the nitride-based light emitting device and internal quantum efficiency are deteriorated.

To solve such a problem, in another related art, a transparent electrode 105 is used between the p-electrode 120 and the p-type semiconductor layer 104 by depositing the transparent electrode 105 on the entire surface of the p-type semiconductor layer 104. However, it is difficult to fundamentally solve the problem.

DISCLOSURE OF INVENTION

Technical Problem

Accordingly, there is provided a light emitting device using a compound semiconductor, which can improve electrical characteristics and internal quantum efficiency by maximizing the recombination rate of electrons and holes in an active layer.

Technical Solution

In one aspect, there is provided a light emitting device using a compound semiconductor, which includes a substrate; a compound semiconductor layer formed on the substrate, the compound semiconductor layer comprising an active layer; and a current spreading layer formed on at least one of the top and bottom surfaces of the active layer, the current spreading layer allowing electrons or holes to be uniformly spread into the active layer.

The current spreading layer may be formed of a group III-V nitride semiconductor or a group II-VI oxide semiconductor. The group III-V nitride semiconductor may be formed of a material expressed by a general formula $In_x(Al_yGa_{1-y})N$ ($0 \leq x \leq 1$, $0 \leq y \leq 1$), and the group II-VI oxide semiconductor may be formed of a material expressed by a general formula $Mg_xZn_{1-x}O$ ($0 \leq x \leq 1$).

The current spreading layer may include one or more unit current spreading layers, and each of the unit current spreading layers may include a plurality of current guide layers. The current guide layer may be doped with n-type or p-type impurity ions. When the current guide layer is doped with n-type impurity ions, the doping concentration of the n-type impurity ions in the current guide layer may be smaller than $5 \times 10^{19}$ cm$^{-3}$. When the current guide layer is doped with p-type impurity ions, the doping concentration of the p-type impurity ions in the current guide layer may be smaller than $1 \times 10^{20}$ cm$^{-3}$. Here, it is preferred that the current guide layer have a thickness of 1 to 300 nm.

In the plurality of current guide layers constituting the unit current spreading layer, the doping concentration ratio between a current guide layer having the maximum concentration and a current guide layer having the minimum concentration may be from 1:0.00001 to 1:0.5. A current guide layer undoped with impurity ions may be provided in the plurality of current guide layers constituting the unit current spreading layer In the plurality of current guide layers constituting the unit current spreading layer, each of the current guide layer may be a layer undoped with impurity ions, a layer doped with impurity ions having a relatively low concentration, or a layer doped with impurity ions having a relatively high concentration. A unit current spreading layer is formed by combining one or more current guide layers. Current may be uniformly spread into the current spreading layer in a horizontal direction of the current spreading layer due to the resistance difference between the respective current guide layers in the unit current spreading layer, and uniformly spread into the active layer.

The substrate may include any one of a silicon (Si) substrate, a GaAs substrate, an MgO substrate and a sapphire ($Al_2O_3$) substrate, or a template substrate formed by laminating any one of GaN, InGaN, AlGaN and AlInGaN on any one of these substrates.

Advantageous Effects

A light emitting device using a compound semiconductor and a method of fabricating the same, disclosed herein, have advantageous effects as follows.

A current spreading layer doped with n-type or p-type impurity ions having a predetermined concentration is formed on at least one of the top and bottom surfaces of an active layer, so that the recombination rate of electrons and holes in the active layer may be maximized when an electric field is applied, and current may be uniformly spread into the active layer. Consequently, electrical characteristics such as leakage current and breakdown voltage and internal quantum efficiency of the light emitting device may be improved. Further, electrostatic characteristics and reliability of the light emitting device may be improved.

BRIEF DESCRIPTION OF DRAWINGS

The above and other aspects, features and advantages of the disclosed exemplary embodiments will be more apparent from the following detailed description taken in conjunction with the accompanying drawings in which:

FIG. 1 is a cross-sectional view showing the structure of a nitride-based light emitting device according to a related art;

FIG. 2 is a cross-sectional view showing the structure of a light emitting device using a compound semiconductor according to an embodiment disclosed herein;

FIG. 3 is a cross-sectional view showing the structure of a current spreading layer according to the embodiment disclosed herein;

FIG. 4 is a cross-sectional view showing the structure of an n-type current spreading layer according to the embodiment disclosed herein; and FIG. 5 is a cross-sectional view showing the structure of a p-type current spreading layer according to the embodiment disclosed herein.

MODE FOR THE INVENTION

Exemplary embodiments now will be described more fully hereinafter with reference to the accompanying drawings, in which exemplary embodiments are shown. This disclosure may, however, be embodied in many different forms and should not be construed as limited to the exemplary embodiments set forth therein. Rather, these exemplary embodiments are provided so that this disclosure will be thorough and complete, and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms a, an and the are intended to include the plural forms as well, unless the context clearly indicates otherwise. Furthermore, the use of the terms a, an, etc. does not denote a limitation of quantity, but rather denotes the presence of at least one of the referenced item. It will be further understood that the terms "comprises" and/or "comprising" or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, like reference numerals in the drawings denote like elements. The shape, size and regions, and the like, of the drawing may be exaggerated for clarity.

FIG. 2 is a cross-sectional view showing the structure of a light emitting device using a compound semiconductor according to an embodiment disclosed herein. FIG. 3 is a cross-sectional view showing the structure of a current spreading layer according to the embodiment disclosed herein. FIG. 4 is a cross-sectional view showing the structure of an n-type current spreading layer according to the embodiment disclosed herein. And, FIG. 5 is a cross-sectional view showing the structure of a p-type current spreading layer according to the embodiment disclosed herein.

As shown in FIG. 2, the nitride-based light emitting device according to the embodiment disclosed herein includes a substrate 201 and a compound semiconductor layer formed on the substrate 201. The compound semiconductor layer includes an n-type semiconductor layer 202, an active layer 203, a p-type semiconductor layer 204 and a current spreading layer. The current spreading layer may be formed on the top surface, the bottom surface or both the top and bottom surfaces of the active layer 203. For example, the current spreading layer may be formed between the n-type semiconductor layer 202 and the active layer 203 or between the active layer 203 and the p-type semiconductor layer 204, or may be formed between the n-type semiconductor layer 202 and the active layer 203 and between the active layer 203 and the p-type semiconductor layer 204. Although not shown in FIG. 2, an n-electrode and a p-electrode are provided for applying an electric field at one side of the light emitting device using a compound semiconductor according to the embodiment disclosed herein. For reference, light emitting devices are divided into horizontal and vertical types depending on their shapes. The light emitting device disclosed herein may be applied to both the horizontal- and vertical-type light emitting devices.

The substrate 201 may include any one of a silicon (Si) substrate, a GaAs substrate, an MgO substrate and a sapphire ($Al_2O_3$) substrate, or a template substrate 201 formed by laminating any one of GaN, InGaN, AlGaN and AlInGaN on any one of these substrates.

The n-type semiconductor layer 202, the active layer 203, the p-type semiconductor layer 204 and the current spreading layer, which constitute the compound semiconductor layer, are all formed of compound semiconductors. In one embodiment, the compound semiconductor layer may be formed of a group III-V nitride semiconductor or a group II-VI oxide semiconductor. Here, a material expressed by a general formula $In_x(Al_yGa_{1-y})N$ ($0 \leq x \leq 1$, $0 \leq y \leq 1$) may be used as the group III-V nitride semiconductor, and a material expressed by a general formula $Mg_xZn_{1-x}O$ ($0 \leq x \leq 1$) may be used as the group II-VI oxide semiconductor.

When an electric field is applied to the n-electrode and p-electrode, the n-type and p-type semiconductor layers 202 and 204 respectively generate electrons and holes and supply the electrons and holes to the active layer 203. Consequently, the n-type and p-type semiconductor layers 202 and 204 induce electrons and holes to be recombined in the active layer 203.

The current spreading layer has electrons and holes at a predetermined concentration and supplies the electrons or holes to the active layer 203 when an electric field is applied, so that current is uniformly spread into the entire region of the active layer 203. To this end, the current spreading layer is doped with n-type or p-type impurity ions. The current spreading layer doped with the p-type impurity ions is formed between the active layer 203 and the p-type semiconductor layer 204, and the current spreading layer doped with the n-type impurity ions is formed between the n-type semiconductor layer 202 and the active layer 203. Hereinafter, the current spreading layer formed between the n-type semiconductor layer 202 and the active layer 203 is referred to as an n-type current spreading layer, and the current spreading layer formed between the active layer 203 and the p-type semiconductor layer 204 is referred to as a p-type current spreading layer, for convenience of illustration.

As shown in FIG. 3, the current spreading layer includes one or more unit current spreading layers, and each of the unit current spreading layers includes a plurality of current guide layers. The current guide layers constituting the unit current spreading layer are minimum unit layers constituting the current spreading layer. The current guide layer is substantially doped with n-type or p-type impurity ions. It is preferred that the current guide layer have a thickness of 1 to 300 nm.

The plurality of current guide layers constituting one unit current spreading layer may have different doping concentrations or the same doping concentration. But different doping concentrations are preferred. It is preferred that the current guide layers constituting the n-type current spreading layer is doped with n-type impurity ions at a concentration of below $5 \times 10^{19}$ cm$^{-3}$, and it is preferred that the current guide layers constituting the p-type current spreading layer is doped with p-type impurity ions at a concentration of below $1 \times 10^{20}$ cm$^{-3}$. In the plurality of current guide layers constituting the unit current spreading layer, it is preferred that the doping concentration ratio between a current guide layer having the maximum concentration and a current guide layer having the minimum concentration is set as 1:0.00001 to 1:0.5. In addition to the current guide layer doped with impurity ions at the aforementioned concentration, a current guide layer undoped with impurity ions may be provided in the plurality of current guide layers constituting the unit current spreading layer.

FIGS. 4 and 5 show an n-type current spreading layer and a p-type current spreading layer according to the embodiment disclosed herein, respectively. In FIG. 4, a unit current spreading layer 310 includes a current guide layer 301 of a low concentration ($1 \times 10^{17}$ cm$^{-3}$) and a current guide layer 301 of a high concentration ($1 \times 10^{19}$ cm$^{-3}$). The n-type current spreading layer 300 is formed by repeatedly laminating the unit current spreading layer 310 for five times. In FIG. 5, a unit current spreading layer 410 includes a current guide layer 401 of a low concentration ($1 \times 10^{16}$ cm$^{-3}$) and a current guide layer 401 of a high concentration ($5 \times 10^{17}$ cm$^{-3}$). The p-type current spreading layer 400 is formed by repeatedly laminating the unit current spreading layer 410 for five times.

Industrial Applicability

A light emitting device using a compound semiconductor disclosed herein may be widely used in various applications such as flat panel displays, traffic lights, indoor lightings, high-resolution output systems and optical communications.

While the exemplary embodiments have been shown and described, it will be understood by those skilled in the art that various changes in form and details may be made thereto without departing from the spirit and scope of this disclosure as defined by the appended claims.

In addition, many modifications can be made to adapt a particular situation or material to the teachings of this disclosure without departing from the essential scope thereof. Therefore, it is intended that this disclosure not be limited to the particular exemplary embodiments disclosed as the best mode contemplated for carrying out this disclosure, but that this disclosure will include all embodiments falling within the scope of the appended claims.

The invention claimed is:

1. A light emitting device using a compound semiconductor, the light emitting device being a light emitting diode comprising:
   a substrate;
   an active layer formed on the substrate;
   an n-type current spreading layer formed on a bottom surface of the active layer, the n-type current spreading layer allowing electrons to be uniformly spread into the active layer; and
   a p-type current spreading layer formed on a top surface of the active layer, the p-type current spreading layer allowing holes to be uniformly spread into the active layer,
   wherein the n-type current spreading layer and the p-type current spreading layer include two or more unit current spreading layers, each of the unit current spreading layers includes a plurality of current guide layers which are formed of GaN, at least one of the plurality of current guide layers is doped with n-type or p-type impurity ions at a predetermined concentration, and at least one of the plurality of current guide layers is undoped, and a doped current guide layer and an undoped current guide layer are alternately stacked.

2. The light emitting device according to claim 1, wherein the n-type current spreading layer and the p-type current spreading layer are formed of a group III nitride semiconductor.

3. The light emitting device according to claim 1, wherein, the n-type current spreading layer has the doping concentration smaller than $5 \times 10^{19}$ cm$^{-3}$.

4. The light emitting device according to claim 1, wherein, the p-type current spreading layer has the doping concentration smaller than $1 \times 10^{20}$ cm$^{-3}$.

5. The light emitting device according to claim 1, wherein, in the plurality of current guide layers constituting the unit current spreading layer, the doping concentration ratio between a current guide layer having the maximum concentration and a current guide layer having the minimum concentration is from 1:0.00001 to 1:0.5.

6. The light emitting device according to claim 1, wherein the current guide layer has a thickness of 1 to 300 nm.

7. The light emitting device according to claim 1, wherein the substrate includes anyone of a silicon (Si) substrate, a GaAs substrate, MgO substrate and a sapphire ($Al_2O_3$) substrate, or a template substrate formed by laminating anyone of GaN, InGaN, AlGaN and AlInGaN on anyone of said substrates.

8. The light emitting device according to claim 1, wherein the current spreading layer is formed of a group II-oxide semiconductor.

9. The light emitting device according to claim 8, wherein the group II-oxide semiconductor is formed of a material represented by a general formula $Mg_xZn_{1-x}O$ ($0<x<1$).

10. The light emitting device according to claim 2, wherein the group III nitride semiconductor is formed of a material represented by a general formula $In_x(Al_yGa_{1-y})N$ ($0\leq x<1$, $0<y<1$).

* * * * *